United States Patent
Johnston

(10) Patent No.: US 11,218,234 B2
(45) Date of Patent: Jan. 4, 2022

(54) METHOD OF GENERATING A CONTROL SIGNAL FOR USE IN A SIGNAL DYNAMICS PROCESSOR

(71) Applicant: DIGICO (UK) LTD, Chessington (GB)

(72) Inventor: Peter Johnston, Sorbiton (GB)

(73) Assignee: DIGICO (UK) LTD, Chessington (GB)

(*) Notice: Subject to any disclaimer, the term of this patent is extended or adjusted under 35 U.S.C. 154(b) by 0 days.

(21) Appl. No.: 17/070,111

(22) Filed: Oct. 14, 2020

(65) Prior Publication Data

US 2021/0111822 A1 Apr. 15, 2021

(30) Foreign Application Priority Data

Oct. 14, 2019 (GB) .................................. 1914818

(51) Int. Cl.
| | |
|---|---|
| *H03G 7/00* | (2006.01) |
| *H03G 3/20* | (2006.01) |
| *H04H 60/04* | (2008.01) |
| *H03G 3/02* | (2006.01) |
| *H04R 5/04* | (2006.01) |

(52) U.S. Cl.
CPC .............. *H04H 60/04* (2013.01); *H03G 3/02* (2013.01); *H04R 5/04* (2013.01)

(58) Field of Classification Search
CPC . H04R 25/356; G10L 21/0316; G10L 21/034; H03G 3/3005; H03G 3/3089; H03G 7/007
USPC ........................................ 381/104, 106, 107
See application file for complete search history.

(56) References Cited

U.S. PATENT DOCUMENTS

| | | | |
|---|---|---|---|
| 2007/0076905 A1* | 4/2007 | Konagai ................. | H04R 1/403 381/104 |
| 2008/0007332 A1 | 1/2008 | Dubowsky | |
| 2019/0200141 A1 | 6/2019 | Thomsen et al. | |

FOREIGN PATENT DOCUMENTS

GB 2354139 1/2004

OTHER PUBLICATIONS

UK IPO, Combined Search and Examination Report in corresponding GB application 1914818.8, dated Dec. 23, 2019.

* cited by examiner

*Primary Examiner* — George C Monikang
(74) *Attorney, Agent, or Firm* — Ryan Alley IP

(57) ABSTRACT

Components may modify an audio input signal to produce an output audio signal. The audio input signal is firstly rectified and sent to the peak detector as an input control signal. The peak detector produces a peak value which correlates to the level of the input control signal. The control signal is then sent from the peak detector to a dynamic curve module, which has two user selectable inputs: a threshold level and a knee/dynamic angle. The control signal is then sent from the dynamic curve module to the signal dynamics processor. This processor is then configurable to modify the control signal by applying an attack and release phase waveform to elements of the signal which exceed the threshold set by the user. The user will have selected the release time and the release phase shape prior to use of the processor. The release shape is selected by the user.

6 Claims, 4 Drawing Sheets

METHOD OF GENERATING A CONTROL SIGNAL FOR USE IN A SIGNAL DYNAMICS PROCESSOR

RELATED APPLICATIONS

This application claims priority under 35 U.S.C. § 119 to co-pending GB Application 1914818.8, filed Oct. 14, 2019 and incorporated by reference herein in its entirety.

FIELD

The present invention relates generally to a method of generating a control signal for use in a signal dynamics processor and finds particular, although not exclusive, utility in audio mixing desks.

BACKGROUND

It is known to modify audio signals by the use of dynamic processors/controllers, such as compressors and expanders. These processors apply an attack and release waveform to modify the audio signal. In this regard, it may be a control signal which is modified, rather than the audio signal itself, the control signal being applied via the processor and other components to thereby modify the audio signal. Such processors typically rely on fixed release waveform shapes such as linear, exponential, or emulated release shapes of specific existing analogue devices. However, not all types of audio input are suitable to be modified using such waveforms.

Existing dynamics processors can suffer from unwanted audio side effects such as "pumping" which occurs when fast level changes cause unnatural audio envelopes. Other issues include inter-harmonic modulation which is caused by ripple within the audio frequency range in the control signal. Enforcing slower release times can lead to missed signal transients as the device becomes less responsive to fast level changes. A linear fixed gradient will vary in duration according to the starting level and therefore louder signals will have a longer release time than quieter signals.

SUMMARY

It is desirable to have a dynamic signal processor which is configurable to be suitable to modify a wider range of audio inputs.

In a first aspect, the present invention provides a method of generating a control signal for use in a signal dynamics processor for modifying the gain of an input audio signal, the method comprising the following steps:
a) providing a signal dynamics processor capable of modifying an input control signal to generate a sequence of output control signals, wherein the input control signal corresponds to the gain of the input audio signal, and wherein the modification is effected by the application of an attack and release waveform_ to said input control signal;
b) providing a sample and hold circuit;
c) providing a shape selector for selecting the shape of the release portion of the attack and release waveform used by said processor;
d) providing a release time selector for selecting a release time;
e) identifying the magnitude of the output control signal at the end of the attack phase and using the sample and hold circuit to sample said output control signal and retain it as a held value;
f) generating subsequent output control signals, over the duration of the release phase, based on the selected release shape portion, the selected release time, the previously generated output control signal and the held value; wherein the output control signals are subsequently used to affect the gain of the input audio signal to thereby generate an output audio signal.

The shape selector for selecting the shape of the release portion of the attack and release waveform may be a user input means. The user input means may comprise a potentiometer, a touch screen, a scroll wheel, or an array of buttons. Other input means are also contemplated. The release time selector for selecting the release time may also be a user input means comprising a potentiometer, a touch screen, a scroll wheel, an array of buttons, or other input means. The release time selector may be for selecting a release time of the input control signal of the release portion of the attack and release waveform.

It is to be understood that the invention may be put into practice with the use of solid-state components, or software, or a combination of both. For instance, a potentiometer for selecting the shape may be a virtual potentiometer and a potentiometer for selecting the time may simply be the ability to assign graphically a value to an integer for use in the processor.

The invention enables more accurate, higher quality, dynamics control which is less prone to distortion and erratic level changes.

The shape of the release portion may be selectable within a continuum bounded by a first constraint having an exponential shape and a second constraint having an inverse exponential shape, the continuum including a linear shape. An inverse exponential release shape may provide flexible compression gain adjustment which may allow control of fast responding level changes with vastly reduced pumping and control ripple so as to reduce inter-harmonic modulation of the output signal. Linear and inverse exponential release shapes may be considered to be "time tempered". This means that the release time may be stable and accurate and not vary with signals of different levels or different changes in level.

The release portion may have an inverse exponential shape, the shape being variably selectable. In this regard, variously selectable may mean that the release shape may be continuously variable rather than fixed. It may therefore be "tuned" to suit a large variety of audio types such as vocals, various musical instruments and so on. In this way, the inverse exponential curve may produce more natural sounding audio and allow more accurate control over the dynamic range.

The subsequent output control signals may be generated using the following formula:

$$y(n) = x[n] \cdot C_1 + h[n] \cdot C_2 + y[n-1] \cdot C_3 + y[n-1]$$

where y(n) is the generated output control signal and is defined by y[n]=MAX(y[n], x[n]);
x[n] is the input control signal;
h[n] is the held value, defined as the output value at the start of the release phase;
$C_1 = \log(s)/((s-1) \cdot (r \cdot f_s))$, where s is the shape of the release portion defined by a number, the number being generated as a result of the user selection in step c) of claim 1, r is the release time and $f_s$ is a sample rate of the signal dynamics processor;
$C_2 = -s \cdot C_1$; and $C_3 = \log(s)/(r \cdot f_s)$.

The invention may allow that for any selected release shape the target output control level is reached at the selected release time regardless of the input control signal level.

In a second aspect, the invention provides a control signal generation system for modifying the gain of an input audio signal comprising:
  a) a signal dynamics processor capable of modifying an input control signal to generate a sequence of output control signals, wherein the input control signal corresponds to the gain of the input audio signal, and wherein the modification is effected by the application of an attack and release waveform to said input control signal;
  b) a sample and hold circuit;
  c) a shape selector arranged to select the shape of the release portion of the attack and release waveform used by said processor;
  d) a release time selector arranged to select a release time;
  e) an identification unit arranged to identify the magnitude of the output control signal at the end of the attack phase and using the sample and hold circuit to sample said output control signal and retain it as a held value;
  f) a signal generation unit arranged to generate subsequent output control signals, over the duration of a release phase, based on a selected release shape portion, a selected release time, a previously generated output control signal and a held value.

In a third aspect, the invention provides a method of generating a control signal for use in a signal dynamics processor for modifying the gain of an input audio signal, the method comprising the following steps:
  a) providing a signal dynamics processor capable of modifying an input control signal to generate a sequence of output control signals, wherein the input control signal corresponds to the gain of the input audio signal, and wherein the modification is effected by the application of an attack and release waveform to said input control signal;
  b) providing a sample and hold circuit;
  c) providing a shape selector for selecting the shape of the release portion of the attack and release waveform used by said processor;
  d) providing a release time selector for selecting a release time of the release portion of the attack and release waveform used by said processor;
  e) identifying the magnitude of the output control signal at the end of the attack phase and using the sample and hold circuit to sample said output control signal and retain it as a held value;
  f) generating subsequent output control signals, over the duration of the release phase, based on the selected release shape portion, the selected release time, the previously generated output control signal and the held value; wherein the output control signals are subsequently used to affect the gain of the input audio signal to thereby generate an output audio signal, and the shape of the release portion is selectable such that it has an inverse exponential shape, the shape being variably selectable.

The signal dynamics processor may be a compressor or an expander. The signal dynamics processor may form part of an audio mixing desk. In this regard, the term "desk" includes virtual "desks" operated via tablets, telecommunication devices such as mobile telephones, and other devices which include graphical user interfaces such as screens, laptop computers and the like. The desk may include controls such as faders, input and output sockets, displays, processors, memory and the like. All, or only some of the controls may be represented as graphical user interfaces. Furthermore, although such displays and/or controllers may have analogue representation they may operate digitally. Also, although the audio signals may be input and output in analogue format, they may be processed digitally by the desk.

BRIEF DESCRIPTION OF THE DRAWINGS

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

DETAILED DESCRIPTION

Figure 1:
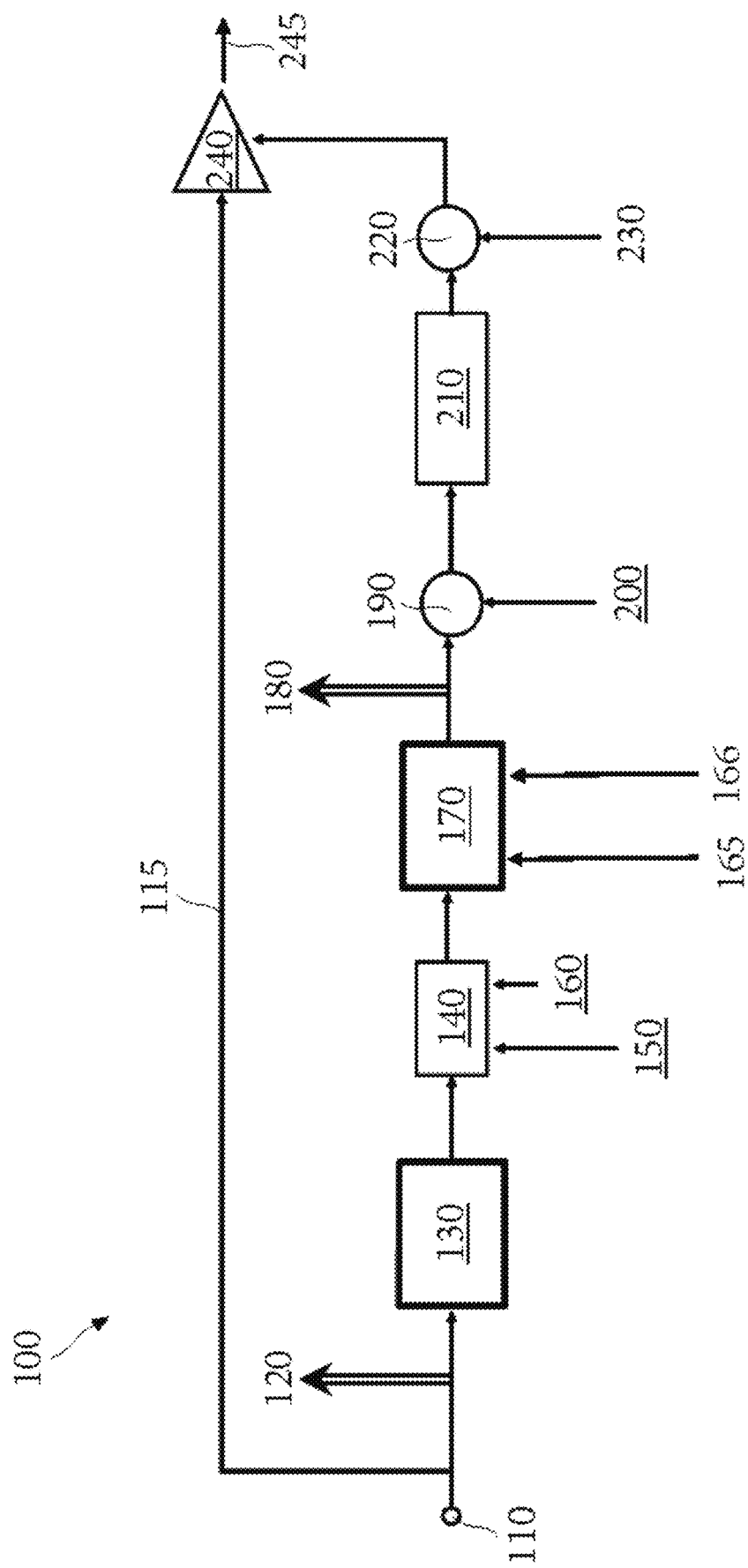
FIG. 1 is a diagram showing the components in an audio dynamics controller, comprising a signal dynamics processor.

The present invention will be described with respect to certain drawings but the invention is not limited thereto but only by the claims. The drawings described are only schematic and are non-limiting. Each drawing may not include all of the features of the invention and therefore should not necessarily be considered to be an embodiment of the invention. In the drawings, the size of some of the elements may be exaggerated and not drawn to scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that operation is capable in other sequences than described or illustrated herein. Likewise, method steps described or claimed in a particular sequence may be understood to operate in a different sequence.

Moreover, the terms top, bottom, over, under and the like in the description and the claims are used for descriptive purposes and not necessarily for describing relative positions. It is to be understood that the terms so used are interchangeable under appropriate circumstances and that operation is capable in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Similarly, it is to be noticed that the term "connected", used in the description, should not be interpreted as being restricted to direct connections only. Thus, the scope of the expression "a device A connected to a device B" should not be limited to devices or systems wherein an output of device A is directly connected to an input of device B. It means that there exists a path between an output of A and an input of B which may be a path including other devices or means. "Connected" may mean that two or more elements are either in direct physical or electrical contact, or that two or more elements are not in direct contact with each other but yet still co-operate or interact with each other. For instance, wireless connectivity is contemplated.

Reference throughout this specification to "an embodiment" or "an aspect" means that a particular feature, structure or characteristic described in connection with the embodiment or aspect is included in at least one embodiment or aspect of the present invention, Thus, appearances of the phrases "in one embodiment", "in an embodiment", or "in an aspect" in various places throughout this specification are not necessarily all referring to the same embodiment or aspect, but may refer to different embodiments or aspects. Furthermore, the particular features, structures or characteristics of any one embodiment or aspect of the invention may be combined in any suitable manner with any other particular feature, structure or characteristic of another embodiment or aspect of the invention, as would be apparent to one of ordinary skill in the art from this disclosure, in one or more embodiments or aspects.

Similarly, it should be appreciated that in the description various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Moreover, the description of any individual drawing or aspect should not necessarily be considered to be an embodiment of the invention. Rather, as the following claims reflect, inventive aspects lie in fewer than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some features included in other embodiments, combinations of features of different embodiments are meant to be within the scope of the invention, and form yet further embodiments, as will be understood by those skilled in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In the discussion of the invention, unless stated to the contrary, the disclosure of alternative values for the upper or lower limit of the permitted range of a parameter, coupled with an indication that one of said values is more highly preferred than the other, is to be construed as an implied statement that each intermediate value of said parameter, lying between the more preferred and the less preferred of said alternatives, is itself preferred to said less preferred value and also to each value lying between said less preferred value and said intermediate value.

The use of the term "at least one" may mean only one in certain circumstances. The use of the term "any" may mean "all" and/or "each" in certain circumstances.

The principles of the invention will now be described by a detailed description of at least one drawing relating to exemplary features. It is clear that other arrangements can be configured according to the knowledge of persons skilled in the art without departing from the underlying concept or technical teaching, the invention being limited only by the terms of the appended claims.

FIG. 1 is a simplified diagram showing the components in an audio dynamics controller 100. The components may be used to modify an audio input signal 110 to produce an output audio signal 245. The audio input signal 110 is firstly rectified and sent to the peak detector 130 as an input control signal. The peak detector 130 produces a peak value which correlates to the level of the input control signal.

The control signal is then sent from the peak detector 130 to a dynamic curve module 140, which has two user selectable inputs: a threshold level 150 and a knee/dynamic angle 160.

The control signal is then sent from the dynamic curve module 140 to the signal dynamics processor 170. This processor is then configurable to modify the control signal by applying an attack and release phase waveform to the elements of the signal which exceed the threshold 150 set by the user. The user will have selected the release time 165 and the release phase shape 166 prior to use of the processor. The release shape 166 is selected by the user using a numerical range of 0.001 to 1500. This may be chosen using a potentiometer. The potentiometer may be marked from 0 to 1, or include any other indicia useful for the user.

The signal dynamics processor 170 may use a typical rising exponential shape as the attack phase. It is a two-state module where during the attack phase the output signal will be lower than the input signal, and during the release phase the output signal will greater than the input signal. The release phase is more complex than the attack phase. The main purpose of the release phase is to provide the release portion of the system's dynamic timing, which comprises a complex set of release shapes to accommodate a user's requirements. The number selected by the user corresponding to the release shape 166 produces different release shapes, including exponential, linear, inverse exponential and all shapes in between. 0.001 corresponds to exponential, 1 corresponds to linear and 1500 corresponds to inverse exponential. Other ranges could be employed corresponding to a similar range of curves/linear release phase forms.

To enable generation of a range of complex release shapes based on the number selected by the user, the signal dynamics processor 107 comprises a sample and hold circuit. The sample and hold circuit samples the control signal output by the signal dynamics processor 107 at the end of the attack phase as a held value. This held value is then utilised to calculate subsequent output control signals, based on the selected release shape, the selected release time 165 and the previously generated output control signal.

The control signal is sent from the signal dynamics processor 170 to the range control 190, which multiplies the control signal by a selectable or predetermined range value 200.

The control signal is sent from the range control 190 to the Log to Lin converter 210, which converts the control signal from a logarithmic scale to a linear scale.

The control signal is sent from the Log to Lin converter 210 to the linear gain multiplier 220, which multiplies the control signal by a selectable or predetermined linear gain value 230.

The control signal is then applied to the input audio signal at gain modification point 240. Finally, the modified input audio signal 245 is output by the audio dynamics controller 100.

The control signal is sampled at two points: at 120 before the peak detector 130, to provide meter data for the threshold, and at 180, before the range control 190, to provide meter data for animation.

Figure 2:
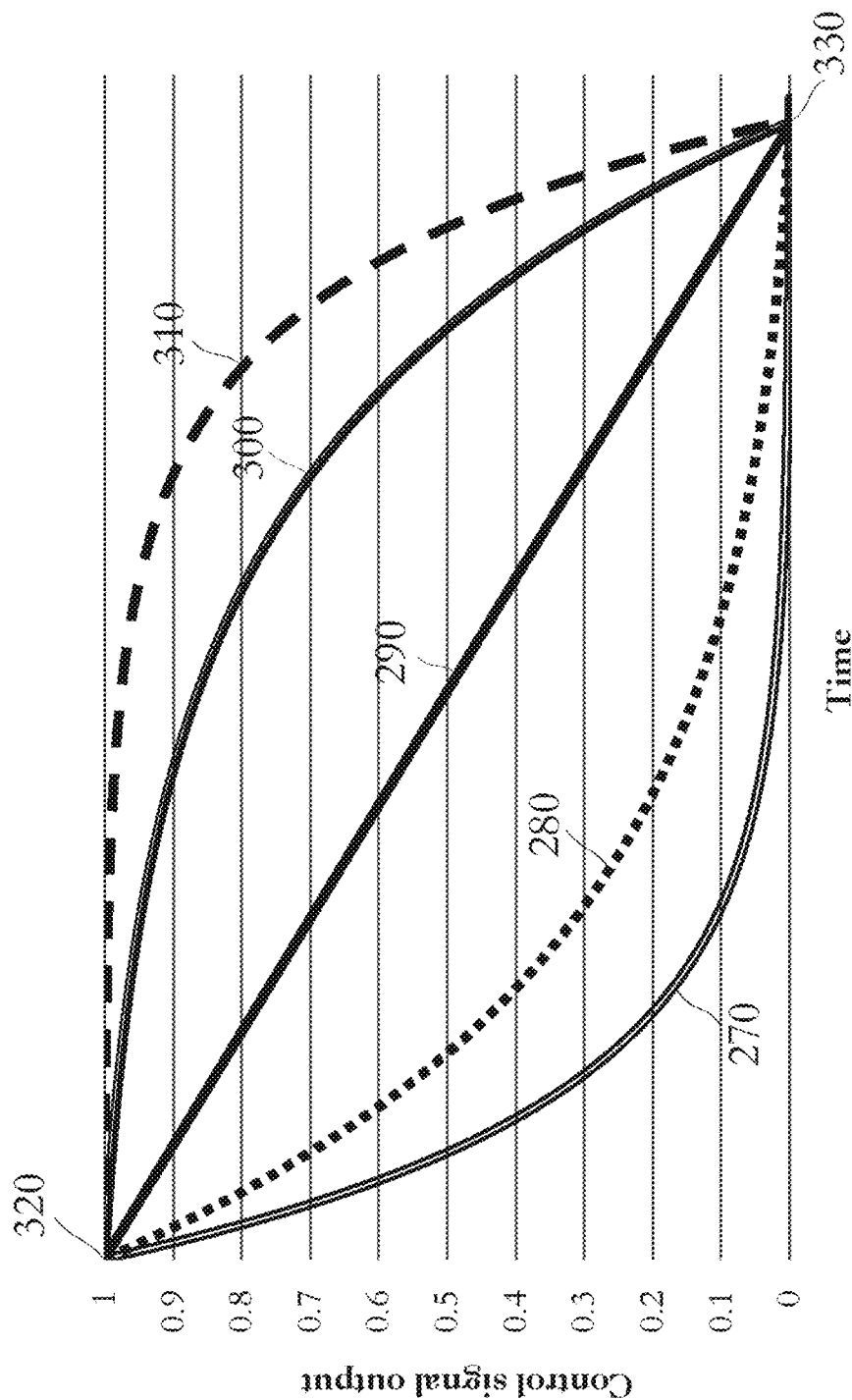
FIG. 2 is a line graph showing a range of possible shapes of a release portion for use in a signal dynamics processor.

FIG. 2 shows a line graph with time on the x axis versus control signal output on the y axis. The line graph shows five different example release shapes generated in accordance with the shape selected by the user. Exponential shape 270 corresponds to s having a value of 0.001. Damped exponential shape 280 corresponds to s having a value between 0.001 and 1. Linear shape 290 corresponds to s having a value of 1. Damped inverse exponential shape 300 corresponds to s having a value of between 1 and 1500. Inverse exponential shape 310 corresponds to s having a value of 1500. In the formulae presented above 's' represents the shape. Irrespective of the release shape selected by the user, each release phase commences at the held value 320 of the control signal output and reaches the same target value 330 within the same time.

Figure 3:
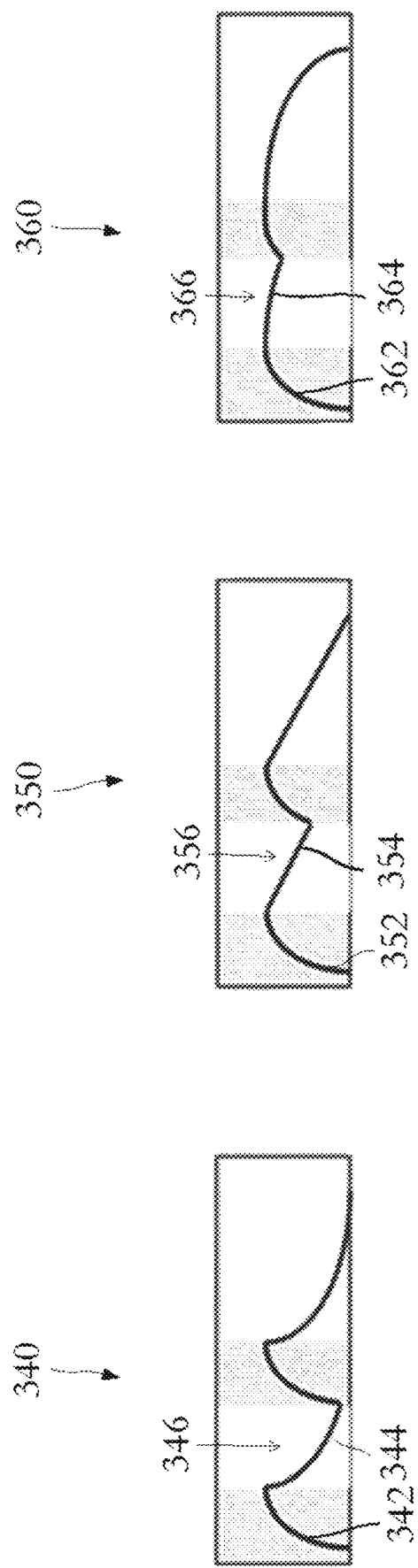
FIG. 3 shows three different control signal waveforms applied to an input audio signal consisting of two bursts of audio.

FIG. 3 shows three different control signal waveforms applied to the same input audio signal comprising two bursts of audio. The x axis represents time and the y axis represents signal level. Attack phases (shown in shaded portions) are applied to an input audio signal when a burst of audio exceeds a threshold level, while release phases commence once the attack phases have expired. The first waveform 340 has an exponential attack phase 342 and an exponential release phase 344, with a sharp dip in control signal 346 where the first release phase has almost reached zero before the second attack phase begins. The second waveform 350 has an exponential attack phase 352 and a linear release phase 354, with a moderate dip in control signal 356 where the first release phase has approximately reached 0.5 before the second attack phase begins. The third waveform 360 has an exponential attack phase 362 and an inverse exponential release phase 364, with a slight dip in control signal 366 where the first release phase has dropped a small amount before the second attack phase begins.

The exponential release phase 344 normally found in signal dynamics controllers would require an exceptionally long release time to reduce the sharp dip 346 in the control signal level between the two bursts of audio. The same is true to a lesser extent for the sharp dip 356 in control level for the linear release phase 354. When the inverse exponential release phase 364 is set to a short release time, it has a much gentler dip 366 in control signal level. The change in overall control signal level is also less obtrusive using an inverse exponential release phase 364, compared to the waveforms with an exponential release phase 344 and a linear release phase 354. While the inverse exponential release phase 364 does not completely eliminate pumping of the modified input audio signal, it does reduce the likelihood of pumping occurring for input audio signals with rapidly changing dynamics.

Figure 4:
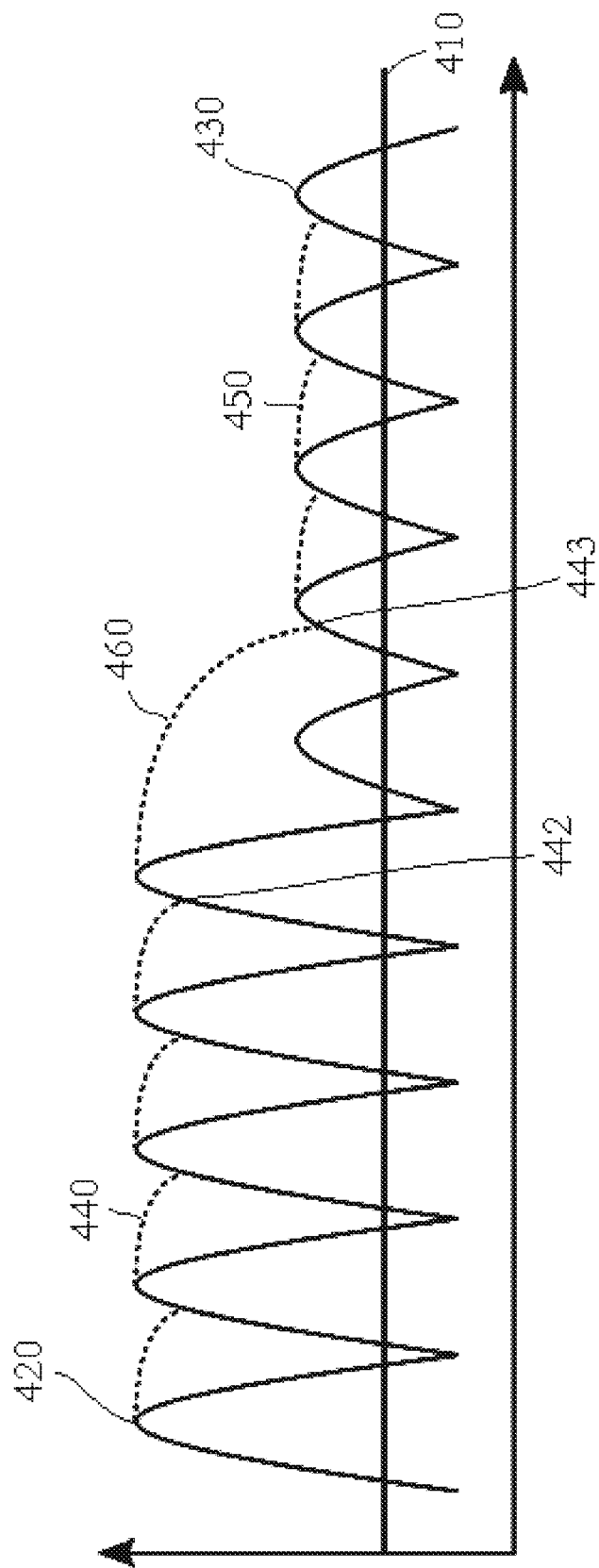
FIG. 4 is a waveform representing how the release shapes can be applied to input signals of different gains.

FIG. 4 is a graph showing an input audio signal as a continuous line with a rectified sinusoidal form, with time on the x axis versus gain on the y axis. The input audio signal has ten peaks in total, with the first five high peaks 420 in the signal on the left-hand side of the graph having a maximum gain four times over a threshold value 410. The threshold value 410 is shown as a straight horizontal line. The last five low peaks 430 in the input audio signal on the right-hand side of the graph have half the gain value of the first five peaks 420 of the input audio signal, and accordingly have a maximum gain double that of the threshold value 410.

The input audio signal is shown in conjunction with a series of control signal release phases generated by a signal dynamics processor after each gain peak. The control signals are shown as broken lines and have an inverse exponential shape. Each control signal release phase commences at the maximum gain value of each audio signal peak, and then decays along an inverse exponential shape.

As the input audio signal rises above the threshold value 410, the processor is configured to compress the audio signal. Accordingly, an attack phase is initiated. A control signal including such an attack phase will occur (not shown).

At the peak 420 of the audio signal the processor is configured to end the attack phase and commence the release phase 440. In the example shown, the control signal decays with an inverse exponential shape form 440 but does not reach a datum level because before it reaches that level the input audio signal level has another incidence of gain above the threshold 410. Accordingly, the release phase of the control signal will continue until decaying until such time as another attack phase is initiated. In the example shown the release phase ends as the audio input signal increases and in this instance is approximately at 90% 442 of its peak. At the peak 420 of the next audio input signal the processor is configured again to end the attack phase and commence the release phase 440. This continues for the first four of the high peaks 420. After the fifth high peak 420, however, the control signal release phase 460 continues for a longer time than the first four control signal release phases 440. This is because the next audio input signal peak 430 is lower than the previous five peaks 420 and accordingly, no attack phase is required because the amount of compression is already greater than needed. However, once the control signal has reduced beyond a certain level then a new attack phase will be required (not shown) followed by another release phase in a similar manner to that discussed above with regard to the first five peaks 420.

Once the control signal release phase has reached the 90% value 443 of the second of the low peaks 430, the release phases commence as before at the end of each attack phase which is determined by the maximum (peak) 430 of the audio input signal.

It is to be noted that the gradient of the control signal curves 440 between the high peaks 420 is steeper than the gradient of the control signal curves 450 between the low peaks 430. This is because the gradient of the release curve is calculated using a "held value" (i.e. its value at the end of the attack phase) and this value is different between the high and low peaks. In the example shown the high peak 420 held value is approximately double the low peak 430 held value and accordingly the gradient of the control signal release phases 440 between the high peaks 420 is double the gradient of the control signal release phases 450 between the low peaks 430.

The control signals and input audio signals have been shown together in FIG. 4 to aid comprehension of the method. However, it is to be understood that the control signals may be shown with reference to different y-axis units as compared to the audio input signals. Furthermore, although FIG. 4 is directed to an example relating to compression of an audio input signal it is to be appreciated that the method may be used with expansion of an audio input signal. With regard to the "datum level" of the control signal discussed above it is to be understood that this may be equivalent to zero compression or some other value which might result in constant compression of a predetermined amount.

In this way, the control signal release shape dynamically adapts to changes in the input audio signal.

The resultant control signal (including the attack and release phases) are applied (240) to the audio input signal, to thereby produce an audio output signal. The signal may be applied solely or in association with other modifications to the control signal.

The invention claimed is:

1. A method of generating a control signal for use in a signal dynamics processor for modifying the gain of an input audio signal, the method comprising the following steps:
    a) providing a signal dynamics processor capable of modifying an input control signal to generate a sequence of output control signals, wherein the input control signal corresponds to the gain of the input audio signal, and wherein the modification is effected by the application of an attack and release waveform to said input control signal;
    b) providing a sample and hold circuit;
    c) selecting the shape of the release portion of the attack and release waveform used by said processor;
    d) selecting a release time;
    e) identifying the magnitude of the output control signal at the end of the attack phase and using the sample and hold circuit to sample said output control signal and retain it as a held value;
    f) generating subsequent output control signals, over the duration of the release phase, based on the selected release shape portion, the selected release time, the previously generated output control signal and the held value;
    wherein the output control signals are subsequently used to affect the gain of the input audio signal to thereby generate an output audio signal.

2. The method of claim 1, wherein the shape of the release portion is selectable within a continuum bounded by a first constraint having an exponential shape and a second constraint having an inverse exponential shape, the continuum including a linear shape.

3. The method of claim 2, wherein the shape of the release portion is selectable such that it has an inverse exponential shape, the shape being variably selectable.

4. The method of claim 1, wherein the subsequent output control signals are generated using the following formula:

$$y(n)=x[n] \cdot C_1 + h[n] \cdot C_2 + y[n-1] \cdot C_3 + y[n-1]$$

where y(n) is the generated output control signal and is defined by $y[n]=\text{MAX}(y[n], x[n])$;
x[n] is the input control signal;
h[n] is the held value, defined as the output value at the start of the release phase;

$C_1 = \log(s)/((s-1) \cdot (r \cdot f_s))$, where s is the shape of the release portion defined by a number, the number being generated as a result of the user selection in step c) of claim 1, r is the release time and $f_s$ is a sample rate of the signal dynamics processor; and $C_2 = -s \cdot C_1$; and $C_3 = \log(s)/(r \cdot f_s)$.

5. A control signal generation system for modifying the gain of an input audio signal comprising:
    a) a signal dynamics processor capable of modifying an input control signal to generate a sequence of output control signals, wherein the input control signal corresponds to the gain of the input audio signal, and wherein the modification is effected by the application of an attack and release waveform to said input control signal;
    b) a sample and hold circuit;
    c) a shape selector arranged to select the shape of the release portion of the attack and release waveform used by said processor;
    d) a release time selector arranged to select a release time;
    e) an identification unit arranged to identify the magnitude of the output control signal at the end of the attack phase and using the sample and hold circuit to sample said output control signal and retain it as a held value;
    f) a signal generation unit arranged to generate subsequent output control signals, over the duration of a release phase, based on a selected release shape portion, a selected release time, a previously generated output control signal and a held value.

6. A method of generating a control signal for use in a signal dynamics processor for modifying the gain of an input audio signal, the method comprising the following steps:
    a) providing a signal dynamics processor capable of modifying an input control signal to generate a sequence of output control signals, wherein the input control signal corresponds to the gain of the input audio signal, and wherein the modification is effected by the application of an attack and release waveform to said input control signal;
    b) providing a sample and hold circuit;
    c) selecting the shape of the release portion of the attack and release waveform used by said processor;
    d) selecting a release time;
    e) identifying the magnitude of the output control signal at the end of the attack phase and using the sample and hold circuit to sample said output control signal and retain it as a held value;
    f) generating subsequent output control signals, over the duration of the release phase, based on the selected release shape portion, the selected release time, the previously generated output control signal and the held value;
    wherein the output control signals are subsequently used to affect the gain of the input audio signal to thereby generate an output audio signal, and the shape of the release portion is selectable such that it has an inverse exponential shape, the shape being variably selectable.

* * * * *